(12) United States Patent
Chan et al.

(10) Patent No.: US 9,711,244 B1
(45) Date of Patent: Jul. 18, 2017

(54) MEMORY CIRCUIT

(71) Applicant: International Business Machines Corporation, Armonk, NY (US)

(72) Inventors: Yuen H. Chan, Poughkeepsie, NY (US); Silke Penth, Holzgerlingen (DE); David E. Schmitt, Rochester, MN (US); Tobias Werner, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/182,178

(22) Filed: Jun. 14, 2016

(51) Int. Cl.
  *G11C 5/06* (2006.01)
  *G11C 5/02* (2006.01)
  *G11C 29/00* (2006.01)
  *G11C 11/412* (2006.01)
  *G11C 11/402* (2006.01)
  *G11C 13/00* (2006.01)

(52) U.S. Cl.
  CPC ........ *G11C 29/787* (2013.01); *G11C 11/4023* (2013.01); *G11C 11/412* (2013.01); *G11C 5/02* (2013.01); *G11C 5/025* (2013.01); *G11C 5/06* (2013.01); *G11C 13/003* (2013.01); *G11C 13/0026* (2013.01); *G11C 2213/79* (2013.01)

(58) Field of Classification Search
  CPC ....... G11C 5/06; G11C 5/025; G11C 13/0026; G11C 13/003; G11C 2213/79; G11C 5/02
  USPC .......................................................... 365/63
  See application file for complete search history.

(56) References Cited

U.S. PATENT DOCUMENTS

| | | | |
|---|---|---|---|
| 6,172,918 B1 * | 1/2001 | Hidaka ............... | G11C 7/1012 365/189.05 |
| 7,542,330 B2 | 6/2009 | Greene et al. | |
| 8,964,493 B2 | 2/2015 | Penth et al. | |
| 9,047,980 B2 | 6/2015 | Agarwal et al. | |

* cited by examiner

*Primary Examiner* — Ly D Pham
(74) *Attorney, Agent, or Firm* — Kristofer L. Haggerty

(57) ABSTRACT

It is provided a memory circuit comprising n inputs; n+1 columns, wherein each column is connected to a plurality of memory cells; wherein the i-th ($1 \le i \le n-1$) column is configured to be conductive connectable to the i-th input or to the (i+1)-th input or neither to the i-th input nor to the (i+1)-th input; a first FET and a second FET in series configured for connecting the i-th column to a defined voltage level; wherein a first gate signal renders the first FET conductive, if the i-th column is not in conductive connection with the i-th input; wherein a second gate signal renders the second FET conductive, if the i-th column is not in conductive connection with the (i+1)-th input.

16 Claims, 4 Drawing Sheets

MEMORY CIRCUIT

BACKGROUND

The present invention generally relates to memory architecture, in particular to a memory circuit.

With every new generation of processors, the number and density of its memory cells typically increases. As a consequence, the probability of defective memory cells and/or connections between the memory cells usually augments as well.

To ameliorate the effect of defects, spare cells are often incorporated into a memory and substituted for defective cells as needed during a test procedure following the manufacturing process. While this technique may increase the yield, the potential current load of the additional circuitry to effect a substitution of good cells for defective cells, and the potential current load imposed by defective cells remaining in the memory after being functionally replaced may be detrimental. An increased load on ancillary driver circuits can slow the operation of the circuits, increasing access time. Also energy consumption may increase, resulting in higher energy and cooling costs, higher temperatures, and decreased reliability.

SUMMARY

In view of the foregoing, there may be a need for a memory circuit with redundant memory cells having an increased reliability and consuming less energy.

Said need has been addressed with the memory circuits according to the independent claim. Advantageous embodiments are described in the dependent claims.

It is provided a memory circuit comprising n inputs, at least n+1 columns, wherein each column is connected to a plurality of memory cells, wherein the i-th ($1 \leq i \leq n-1$) column is configured to be conductive connectable to the i-th input or to the (i+1)-th input or neither to the i-th input nor to the (i+1)-th input; a first FET and a second FET in series configured for connecting the i-th column to a defined voltage level, wherein a first gate signal renders the first FET conductive, if the i-th column is not in conductive connection with the i-th input, wherein a second gate signal renders the second FET conductive, if the i-th column is not in conductive connection with the (i+1)-th input.

Using only a first FET and a second FET in series to bring the column to a defined potential may allow for surface area savings. Moreover, using only a first FET and a second FET in series may also allow for a reduction of leakage currents and thus power savings.

In an embodiment, the defined voltage level is ground.

According to another embodiment, the defined voltage level is V_DD.

Further, an embodiment of the memory circuit prescribes that both the first FET and the second FET are PFETs. In case the defined voltage level is V_DD, the provision of two PFETs may ensure that the voltage level at the column is not reduced by the threshold voltages of the first FET and the second FET.

In another embodiment of the memory circuit, both the first FET and the second FET are NFETs. Using NFETs may lead to less occupied surface area compared to PFETs.

A further embodiment proposes a memory circuit, wherein one of the first FET and the second FET is a PFET, and wherein the other one of the first FET and second FET is an NFET. Different polarities of the first FET and the second FET may facilitate the wiring. In particular, the number of intersections may be reduced.

According to an additional embodiment of the memory circuit, the memory circuit further comprises n fuse inputs and 2·(n+1) transmission gates, wherein the (2i+1)-th transmission gate is configured to conductively connect the i-th input to the i-th column, if a logic high voltage is neither applied to the i-th fuse input nor to the i+1-th fuse input, and wherein the (2i+2)-th transmission gate is configured to conductively connect the (i+1)-th input to the i-th column, if a logic high voltage is applied to the i+1-th fuse input.

Another embodiment may provide a memory circuit further comprising n NOR-gates, wherein the i-th fuse input and the (i+1)-th fuse input are connected to inputs of the i-th NOR-gate, and wherein the output of the i-th NOR-gate is connected to a regular input of the (2i+1)-th transmission gate.

In a further embodiment, the memory circuit comprises 2n+1 inverters, wherein the 2i-th inverter is connected to the output of the i-th NOR-gate and an inverted input of the (2i+1)-th transmission gate.

According to an additional embodiment, the (2i+1)-th inverter is connected to the (i+1)-th fuse input and an inverted input of the (2i+2)-th transmission gate.

In yet another embodiment, the output of the (2i−1)-th inverter is used as the first gate signal and the (i+1)-th fuse input is used as the second gate signal.

Further, an embodiment of the memory circuit prescribes that the i-th fuse input is used as the first gate signal and that the output of the (2i+1)-th inverter is used as the second gate signal.

According to an additional embodiment, the output of the 2i-th inverter is used as the first gate signal and the output of the (2i+1)-th inverter is used as the second gate signal.

Further, an embodiment of the memory circuit prescribes that the i-th fuse input is used as the first gate signal, and that the (i+1)-th fuse input is used as the second gate signal.

According to an embodiment, the memory cells are SRAM cells.

In another embodiment, the memory cells are DRAM cells.

DETAILED DESCRIPTION

The present invention may be better understood, and its numerous objects, features, and advantages made apparent to those skilled in the art by referencing the accompanying drawings.

Figure 1:
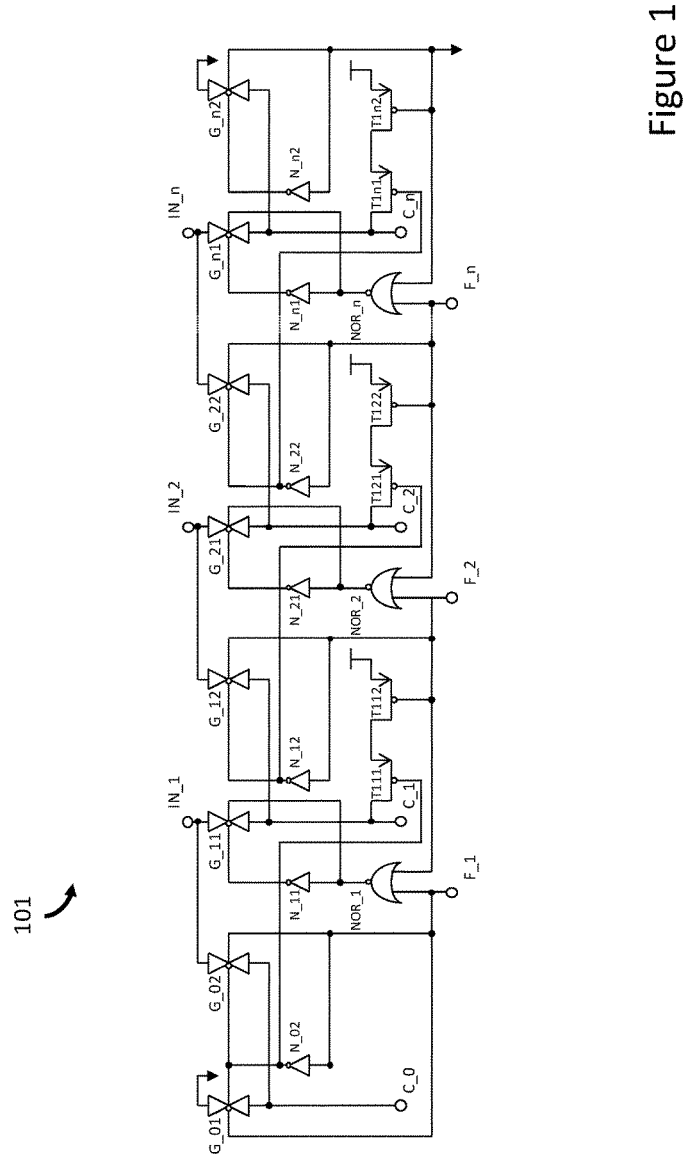
FIG. 1 shows a first memory circuit.

FIG. 1 discloses a first memory circuit 101. The memory circuit comprises n inputs IN_1 to IN_n and (n+1) columns C_0 to C_n, wherein memory cells are connected to each of the columns. The number of columns C_0 to C_n is greater than the number of inputs IN_1 to IN_n. Hence, not all (n+1) columns are used during normal operation.

If none of the columns C_0 to C_n are defective, i.e. none of the memory cells connected to each column and none of the interconnections, every input IN_j may be connected to the columns C_j having the same index. To this end, all fuse inputs F_1 to F_n may be connected to ground. Accordingly, the output of the NOR-gate NOR_1 will be high and the transmission gate G_11 will be conductive and connect to input IN_1 to the column C_1. At the same time, the transmission gate G_02 will disconnect the input IN_1 from the column C_0 and the transmission gate G_01 will connect the column C_0 to ground.

In case testing reveals that the column C_1 is defective, the fuse connected to fuse inputs F_1 may be blown and a high voltage level may be applied to the fuse input F_1. Accordingly, the output of the NOR-gate NOR 1 will assume a low voltage level. In response to this low voltage level, the transmission gate G_11 will close and interrupt the connection between the input IN_1 and the column C_1. At the same time, the transmission gate G_02 will become conductive to the high voltage at its regular input and connect the input IN_1 to the column C_0. As the fuse input F_2 will still be connected to ground, the transmission gate G_12 will remain closed. Thus, the column C_1 will be disconnected from both the input IN_1 and the input IN_2.

Columns with an undefined, i.e. floating, state may be problematic and lead to an undesirable non-deterministic behavior of the memory circuit 101. Thus, a first FET T111 and a second FET T112 are provided in series to allow for applying a defined voltage level to the column C_1. In the embodiment shown in FIG. 1 both the first FET T111 and the second FET T112 are PFETs.

The fuse input F_1 is connected to an inverter N_02, which provides an output, which is used as a first gate signal for controlling the transistor T111. As has been explained hereinbefore, the fuse input F_1 will be at a high voltage level and the fuse input F_2 at ground. Thus, the first gate signal and the second gate signal will both be low and render the first FET T111 and the second FET T112 conductive. Thus, the column C_1 will be connected to the defined voltage level provided at the source of the second FET T112, namely V_DD.

In other circumstances, it may be determined that not the column C_1 but the column C_2 is defective. Accordingly, both fuse inputs F_1 and F_2 may be provided with a high voltage level. This changes the behavior of the second FET T112, which will disconnect the column C_1 from V_DD, and the transmission gate G_12, which will connect the input IN_2 to the column C_1.

Figure 2:
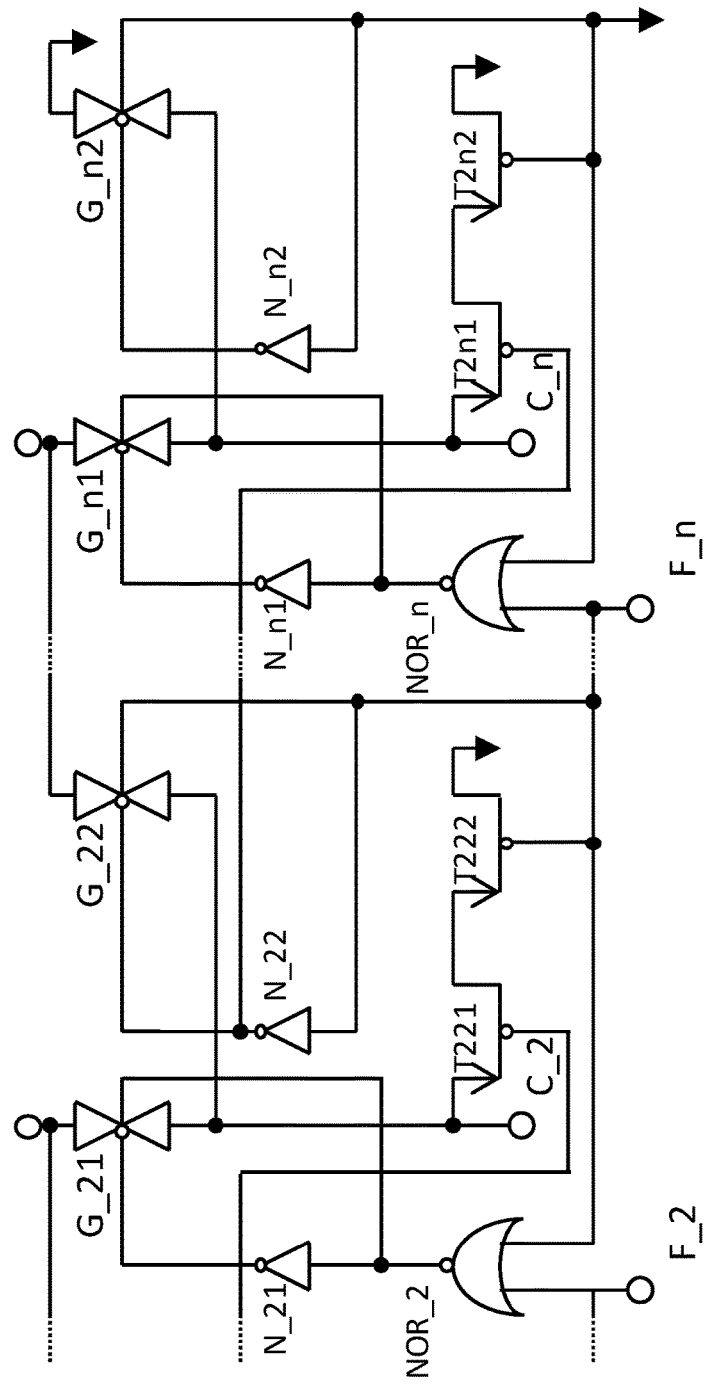
FIG. 2 shows a second memory circuit.

FIG. 2 shows an alternative embodiment of the memory circuit 201, wherein the only difference from FIG. 1 is that the first FETs t2$n$1 and the second FETs t2$n$2 are provided in series to allow for connecting the column C_n to ground instead of V_DD ($1 \leq j \leq n$).

Figure 3:
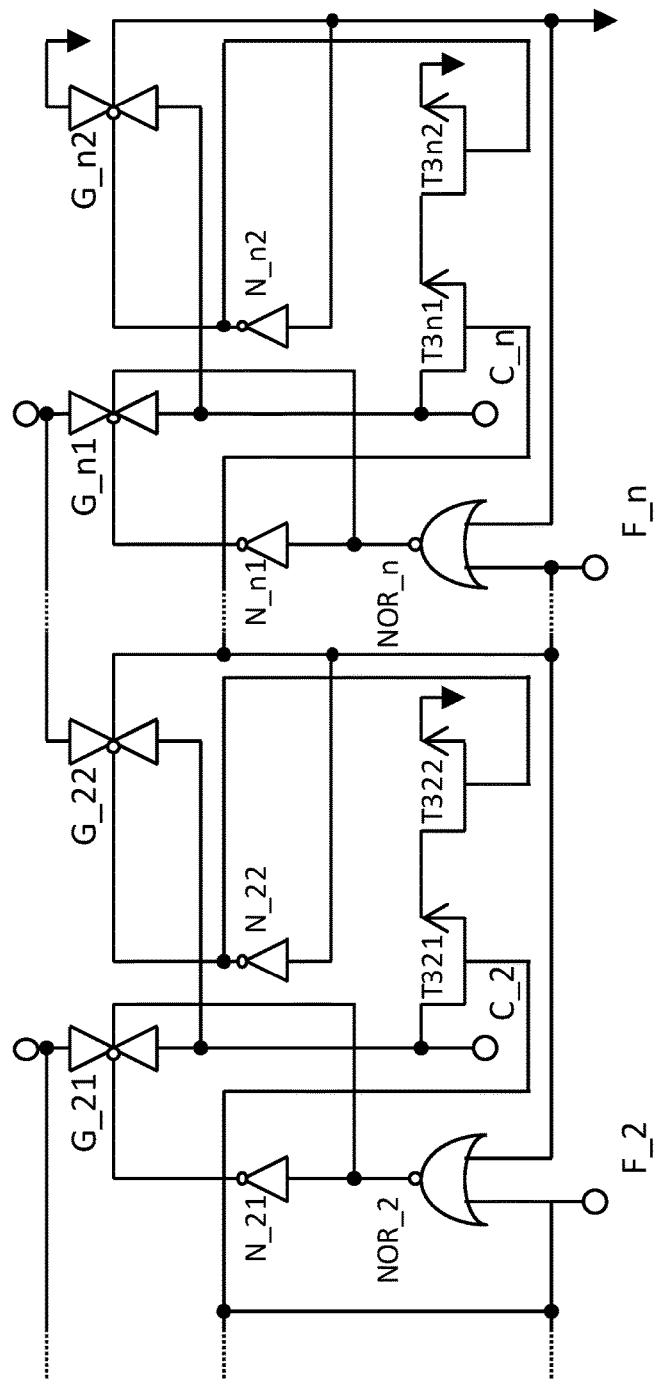
FIG. 3 shows a third memory circuit.

Another embodiment of a memory circuit 301 is shown in FIG. 3. Instead of using PFETs, NFETs are used as first and second FETs. Accordingly, the first gate signal controlling the first FET T321 is connected to the fuse input F_2 and the second gate signal controlling the second FET 322 is connected to the output of the inverter N_22.

Figure 4:
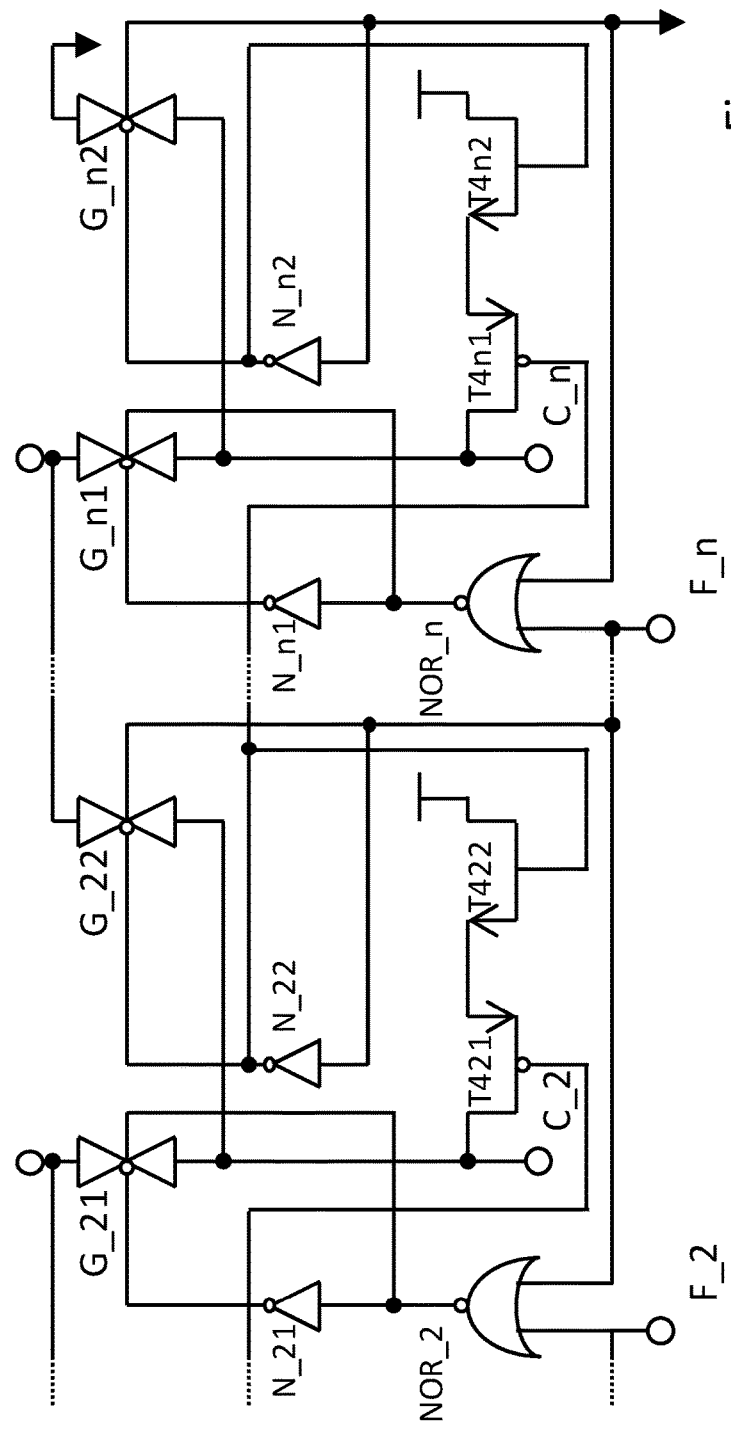
FIG. 4 shows a fourth memory circuit.

FIG. 4 shows a still further embodiment of a memory circuit 401. The memory circuit 401 differs from the memory circuit 101 in that the second transistors T4$n$2 are NFETs and the second gate signals controlling the second FETs T4$n$2 are connected to the output of the inverters N_n2.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory circuit comprising:
   n inputs;
   at least n+1 columns, wherein each column is connected to a plurality of memory cells;
   wherein the i-th ($1 \leq i \leq n-1$) column is configured to be conductively connected to the i-th input, to the (i+1)-th input, or to neither the i-th input nor to the (i+1)-th input;
   a first FET and a second FET in series configured for connecting the i-th column to a defined voltage level;
   wherein a first gate signal renders the first FET conductive if the i-th column is not in conductive connection with the i-th input; and
   wherein a second gate signal renders the second FET conductive, if the i-th column is not in conductive connection with the (i+1)-th input.

2. The memory circuit according to claim 1, wherein the defined voltage level is ground.

3. The memory circuit according to claim 1, wherein the defined voltage level is V_DD.

4. The memory circuit according to claim 1, wherein both the first FET and the second FET are PFETs.

5. The memory circuit according to claim 1, wherein both the first FET and the second FET are NFETs.

6. The memory circuit according to claim 1, wherein one of the first FET and the second FET is a PFET, and wherein the other one of the first FET and second FET is an NFET.

7. The memory circuit according to claim 1, further comprising:
   n fuse inputs;
   2·(n+1) transmission gates;
   wherein the (2i+1)-th transmission gate is configured to conductively connect the i-th input to the i-th column if a logic high voltage is neither applied to the i-th fuse input nor to the (i+1)-th fuse input; and
   wherein the (2i+2)-th transmission gate is configured to conductively connect the (i+1)-th input to the i-th column if a logic high voltage is applied to the i+1-th fuse input.

8. The memory circuit according to claim 7, further comprising:
   n NOR-gates;
   wherein the i-th fuse input and the (i+1)-th fuse input are connected to inputs of the i-th NOR-gate; and
   wherein the output of the i-th NOR-gate is connected to a regular input of the (2i+1)-th transmission gate.

9. The memory circuit according to claim 8, further comprising:
   2n+1 inverters (N_02; N_11, N_12; N_21, N_22; . . . ; N_n1, N_n2);
   wherein the 2i-th inverter is connected to the output of the i-th NOR-gate and an inverted input of the (2i+1)-th transmission gate.

10. The memory circuit according to claim 9, wherein the (2i+1)-th inverter (N_12) is connected to the (i+1)-th fuse input (F_2) and an inverted input of the (2i+2)-th transmission gate (G_12).

11. The memory circuit according to claim 10, wherein the output of the (2i−1)-th inverter (N_02) is used as the first gate signal, and wherein the (i+1)-th fuse input (F_2) is used as the second gate signal.

12. The memory circuit according to claim 10, wherein the i-th fuse input (F_2) is used as the first gate signal, and wherein the output of the (2i+1)-th inverter (N_22) is used as the second gate signal.

13. The memory circuit according to claim 10, wherein the output of the 2i-th inverter is used as the first gate signal, and wherein the output of the (2i+1)-th inverter is used as the second gate signal.

14. The memory circuit according to claim 10, wherein the i-th fuse input is used as the first gate signal, and wherein the (i+1)-th fuse input is used as the second gate signal.

15. The memory circuit according to claim 1, wherein the memory cells are SRAM cells.

16. The memory circuit according to claim 1, wherein the memory cells are DRAM cells.

* * * * *